United States Patent
Fattaruso

(10) Patent No.: US 6,792,019 B2
(45) Date of Patent: Sep. 14, 2004

(54) DRIVER WITH TAIL CURRENTS IN DISCRETE SUBRANGES

(75) Inventor: John W. Fattaruso, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/348,146

(22) Filed: Jan. 21, 2003

(65) Prior Publication Data

US 2003/0160636 A1 Aug. 28, 2003

Related U.S. Application Data

(60) Provisional application No. 60/360,492, filed on Feb. 28, 2002.

(51) Int. Cl.[7] .................................................. H01S 3/00

(52) U.S. Cl. ................................................... 372/38.07

(58) Field of Search ............................. 372/38.1–38.09

(56) References Cited

U.S. PATENT DOCUMENTS 5,883,910 A * 3/1999 Link ..................... 372/38.07

* cited by examiner

Primary Examiner—Quyen Leung
(74) Attorney, Agent, or Firm—Alan K. Stewart; W. James Brady, III; Frederick J. Telecky, Jr.

(57) ABSTRACT

The laser driver circuit includes an array of differential pairs 50 and 52. Each one of the differential pairs is coupled to a corresponding tail current source 67 and 69. The total modulation current for the laser driver circuit is developed as the sum of the output current from the array of differential pairs 50 and 52. Each of the tail current sources 67 and 69 generates a subrange of the total range of modulation current. The tail current in a given differential pair will then only vary over a small subrange of the total modulation current range, and the device size in each pair may be optimized to keep the emitter current density near the level that gives optimum bandwidth. This is equivalent to electrically increasing the emitter area of the composite differential pair as the total modulation current is increased, keeping current density approximately constant at its optimal level.

24 Claims, 6 Drawing Sheets

US 6,792,019 B2

DRIVER WITH TAIL CURRENTS IN DISCRETE SUBRANGES

This application claims priority under 35 USC §119 (e)(1) of provisional application No. 60/360,492 filed Feb. 28, 2002.

FIELD OF THE INVENTION

This invention generally relates to electronic systems and in particular it relates to driver circuits with tail currents in discrete subranges.

BACKGROUND OF THE INVENTION

FIG. 1 shows a prior art driver for optical network laser diodes. The circuitry 20 is typically integrated onto one chip. The "base driver" blocks 22 and 24 convert positive emitter coupled logic (PECL) levels used up to this point to levels appropriate for driving the bases of the final differential pair devices 26 and 28. Resistor 30 is included to pad the dynamic resistance of the laser diode 32 up to a value matching the stripline transmission line impedance used on the circuit board. A dummy load 34 is provided to ensure the differential pair symmetry is undisturbed. Varying amounts of modulation current $I_{MOD}$ and laser bias current $I_{BIAS}$ are supplied by current sources 36 and 38. Generally these sources are actually enclosed in feedback paths to compensate for laser diode temperature and aging drift. The amount of modulation current needed may vary from a few milliamps for a typical vertical cavity surface emitting laser (VCSEL) to 100 milliamps or more for an edge emitting laser (EEL). The circuit of FIG. 1 also includes inductors 40 and 42, capacitor 44, and source voltage $V_{CC}$.

The bipolar devices 26 and 28 in FIG. 1 will exhibit a marked dependence of transition frequency fT on emitter current density JE. FIG. 2 is a plot of a typical device characteristic. As future needs for bit rates are approaching the limits of available processes, it is necessary to optimize current density for amplifier bandwidth. However, if the modulation current can vary over an order of magnitude or more, it is clear that for some lasers the differential pair devices will be operating at current densities giving decidedly suboptimal bandwidths.

Another problem with the prior art device of FIG. 1 is that the current source 36 is formed by a transistor that must be sized to allow the total maximum modulation current to safely flow through it. This results in a very large device, with a large collector-to-substrate capacitance, which adds considerable parasitic capacitance on the differential tail node, the common emitter connection of transistors 26 and 28. When the base drivers 22 and 24 change the base voltages of transistors 26 and 28 in order to change the state of the laser or other output signal, the voltage at this tail node will fluctuate due to the nonlinear behavior of the bipolar transistor. This means that the large parasitic capacitance at that node must be charged with current, and the only place where this current can flow from is the output circuit. In practice, large glitches can be seen on the output current waveform flowing in the collectors of transistors 26 and 28. This is undesirable, as it distorts the ideally square output waveform and can cause errors in the communications system.

SUMMARY OF THE INVENTION

A driver circuit includes an array of differential pairs. Each one of the differential pairs is coupled to a corresponding tail current source. The total modulation current for the driver circuit is developed as the sum of the output current from the array of differential pairs. Each of the tail current sources generates a subrange of the total range of modulation current. The tail current in a given differential pair will then only vary over a small subrange of the total modulation current range, and the device size in each pair may be optimized to keep the emitter current density near the level that gives optimum bandwidth. This is equivalent to electrically increasing the emitter area of the composite differential pair as the total modulation current is increased, keeping current density approximately constant at its optimal level.

DETAILED DESCRIPTION OF PREFERRED EMBODIMENT

Figure 1:
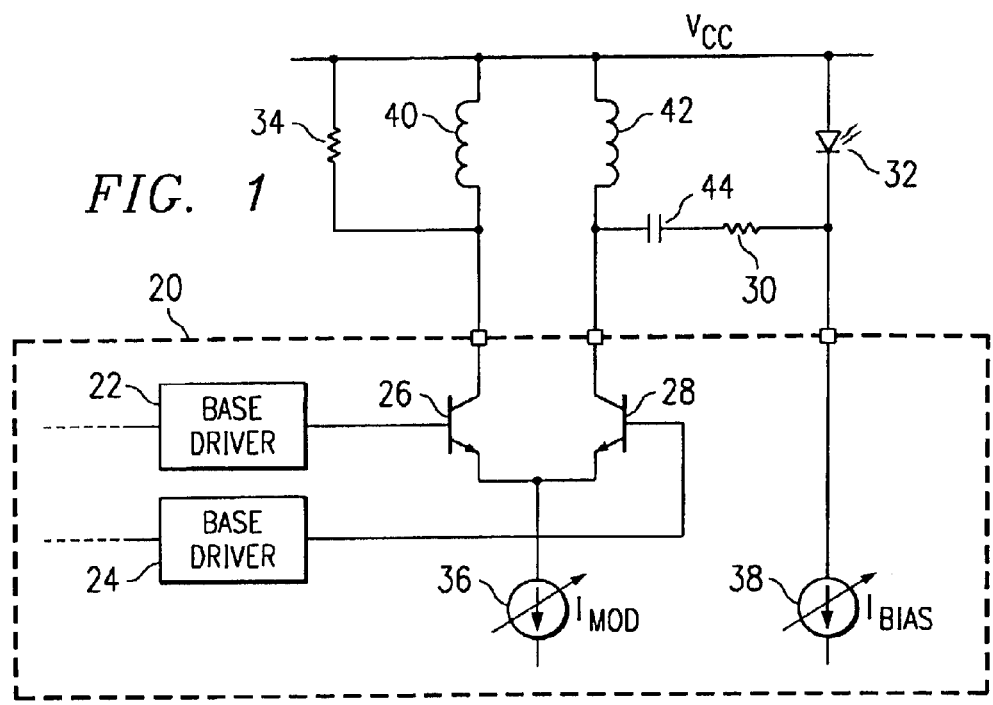
FIG. 1 is a schematic circuit diagram of a prior art laser driver circuit.
Figure 2:
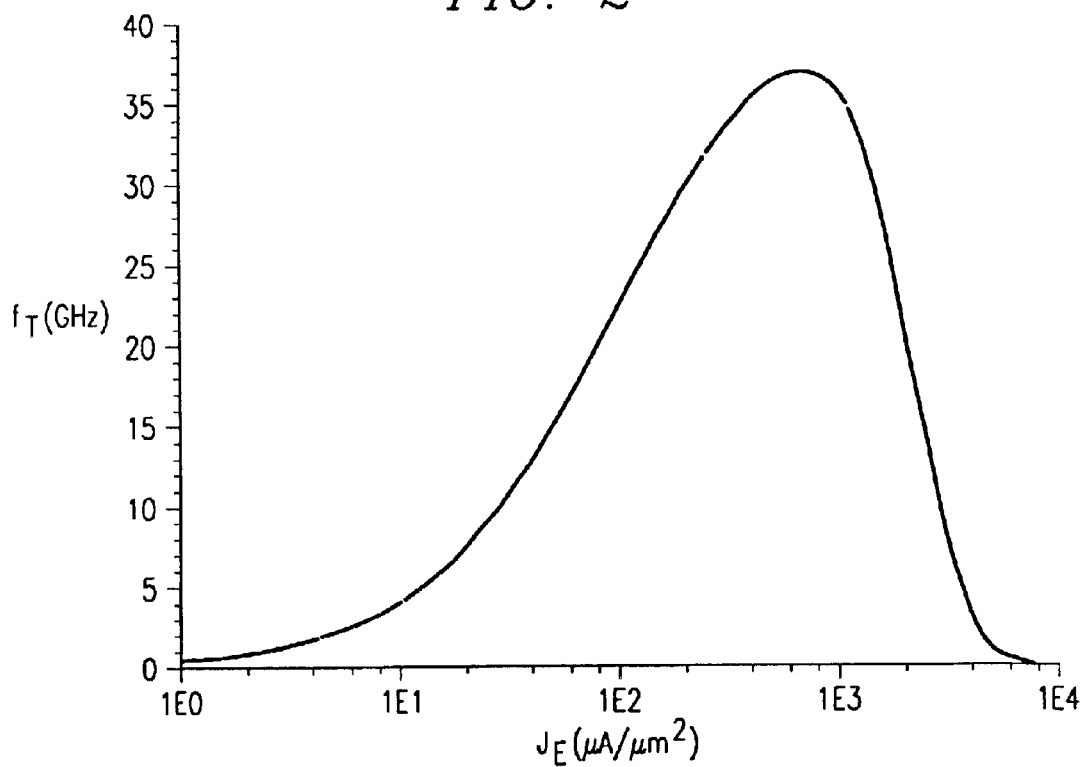
FIG. 2 is a plot of transition frequency vs. emitter current density for the bipolar devices in the circuit of FIG. 1.
Figure 3:
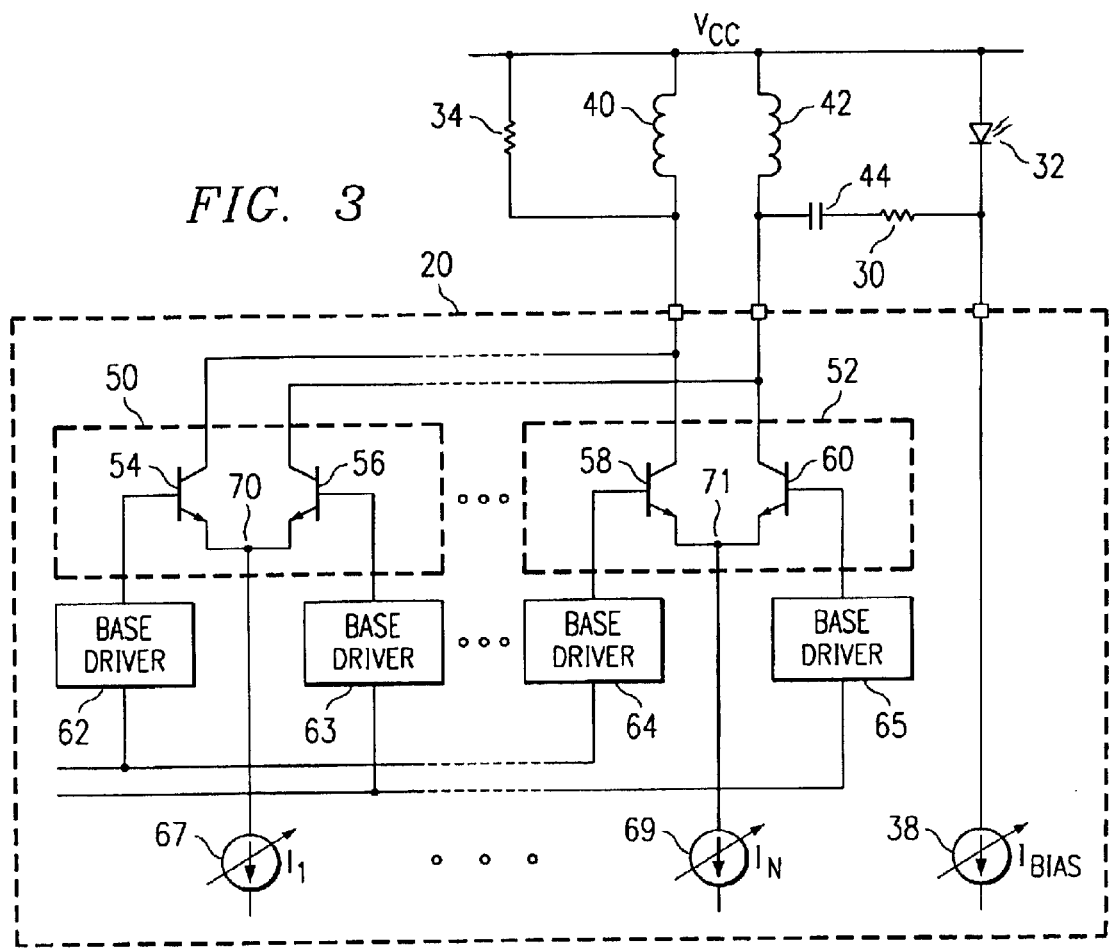
FIG. 3 is a schematic circuit diagram of a preferred embodiment laser driver circuit with tail currents in discrete subranges.

A preferred embodiment structure for the laser driver circuit is shown in FIG. 3. The circuit of FIG. 3 includes an array of N differential pairs of which only differential pairs 50 and 52 are shown. Transistors 54 and 56 form differential pair 50. Transistors 58 and 60 form differential pair 52. The circuit of FIG. 3 also includes base drivers 62–65, and current sources 67 and 69. The total modulation current is developed as the sum of the output current from the array of N differential pairs 50 and 52. Each of the tail currents $I_1$ through $I_N$ generates a subrange of the total range of modulation current.

Figure 4:
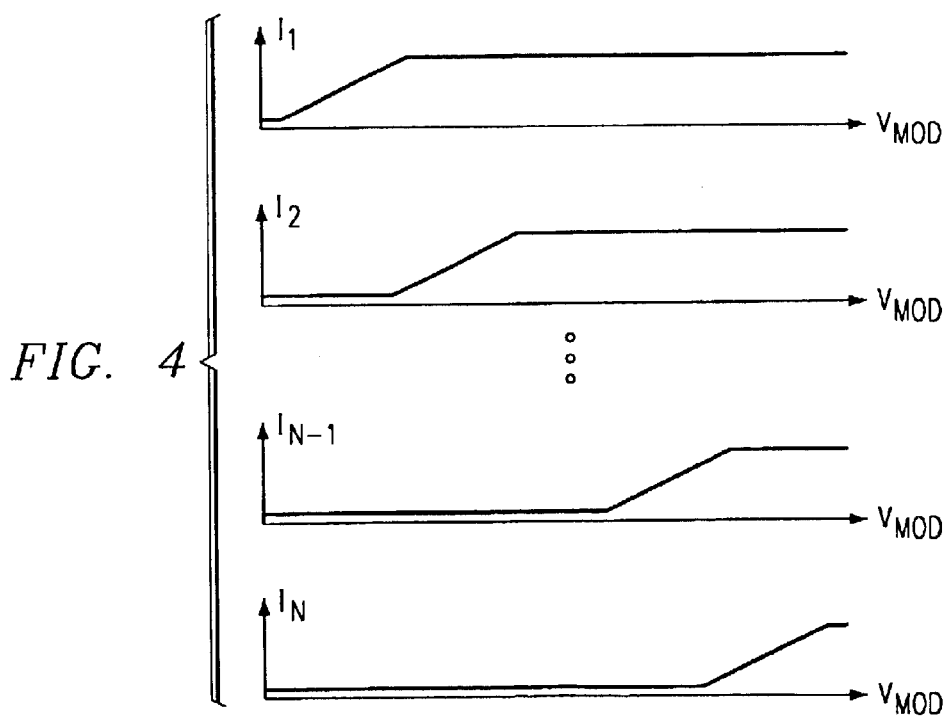
FIG. 4 is a plot of the tail currents for the circuit of FIG. 3 with respect to a master controlling variable.

The N tail currents $I_1$ through $I_N$ are arranged to be controlled by a single input variable, for instance a voltage $V_{MOD}$, that controls the total modulation current. This variable is typically determined by a feedback loop that monitors the laser diode optical output. The characteristic of each tail current $I_1, I_2, I_{N-1}$, and $I_N$ with respect to the master controlling variable $V_{MOD}$ is plotted in FIG. 4. In this way, as more modulation current is needed to satisfy the feedback loop, each successive differential pair is enabled with tail current. The tail current in a given differential pair may then only vary over a small subrange of the total modulation current range, and the device size in each pair may be optimized to keep the emitter current density near the level that gives optimum bandwidth. This is equivalent to electrically increasing the emitter area of the composite differential pair as the total modulation current is increased, keeping current density approximately constant at its optimal level.

Another advantage of the preferred embodiment of FIG. 3 is that the tail current sources $I_1$ and $I_N$ for each differential pair need be only large enough to pass the current required in each subrange. This means smaller devices connected to each of the tail nodes 70 and 71, and smaller parasitic capacitance at each of the tail nodes 70 and 71. This reduces the glitches seen in the output current waveforms when the output state is changed.

Figure 5:
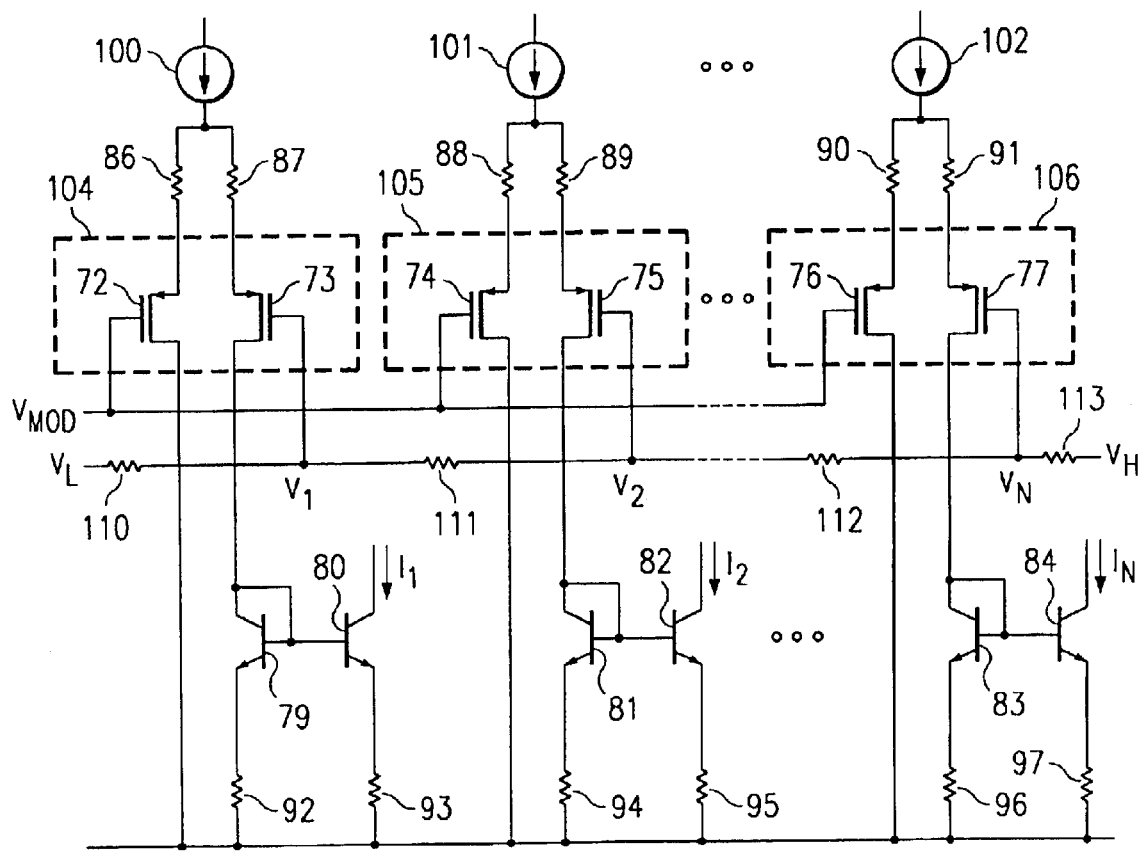
FIG. 5 is a schematic circuit diagram of an example circuit to generate the tail currents for the circuit of FIG. 3.

An example circuit to generate the tail currents $I_1$–$I_N$ is shown in FIG. 5. The circuit of FIG. 5 includes MOS transistors 72–77; bipolar transistors 79–84; resistors 86–97; current sources 100–102; resistors 110–113; controlling voltage $V_{MOD}$; terminal voltages $V_L$ and $V_H$; tap voltages V1, V2, and VN; and tail currents I1, I2, and IN. Simple PMOS differential pair comparators 104–106 sense the relationship between voltage VMOD and a set of discrete tap voltages Vi (V1, V2, and VN) on a resistor string (resistors 110–113) arranged between terminal voltages VL and VH. As voltage VMOD is raised, each comparator gradually diverts its tail current into the bipolar NPN current mirrors formed by transistors 79–84. An approximately piecewise linear characteristic results, with slopes adjustable by ratios of resistances. Care should be taken to ensure some overlap between comparators so that a continuous characteristic is realized, and the overall modulation current feedback loop maintains small signal gain. Note that since this circuit and the surrounding feedback loop is only required to compensate for slow temperature drift, the devices may be small and power consumption low. Alternatively, PNP devices may be used in the comparators if available.

Figure 6:
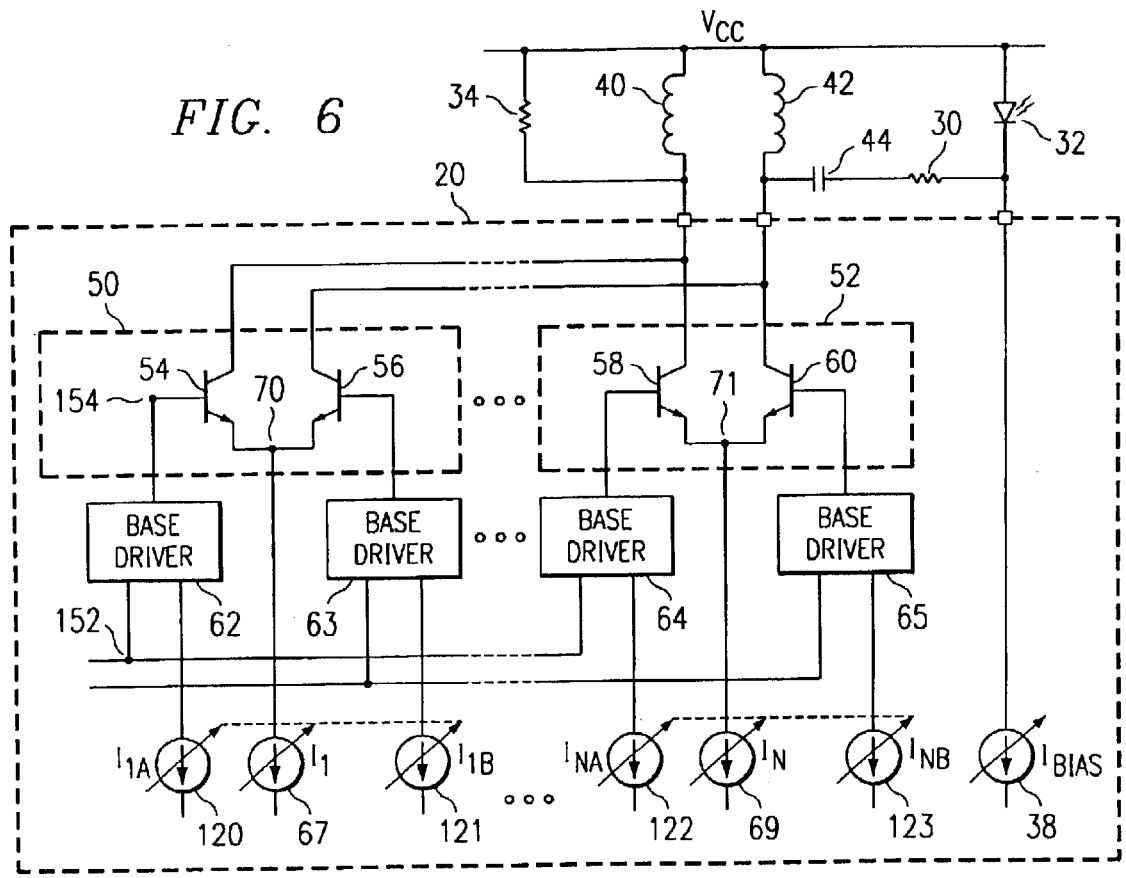
FIG. 6 is a schematic circuit diagram of the preferred embodiment laser driver circuit of FIG.3 with bias current sources for the base drivers.

Additional power savings may be realized by duplicating the tail currents and using the duplicate currents to bias the base driver blocks. In this way, power is only spent to run a base driver for differential pairs that are active. This power saving method is illustrated in FIG. 6. The circuit of FIG. 6 includes the circuit of FIG. 3 with additional current sources 120-123. These additional current sources 120–123 provide N pairs of controlled currents $I_{1A}$ and $I_{1B}$ through $I_{NA}$ and $I_{NB}$. As shown with the dotted lines, for a given value of i, the currents $I_{iA}$, $I_{iB}$ and $I_i$ are all arranged to be responsive to the same control. As the tail current $I_i$ is turned on to activate each corresponding differential pair, the two additional currents $I_{iA}$ and $I_{iB}$ turn on to bias the base drivers for the active region. With this technique, power is conserved because the base drivers are only active when the corresponding differential pair is active.

Figure 7:
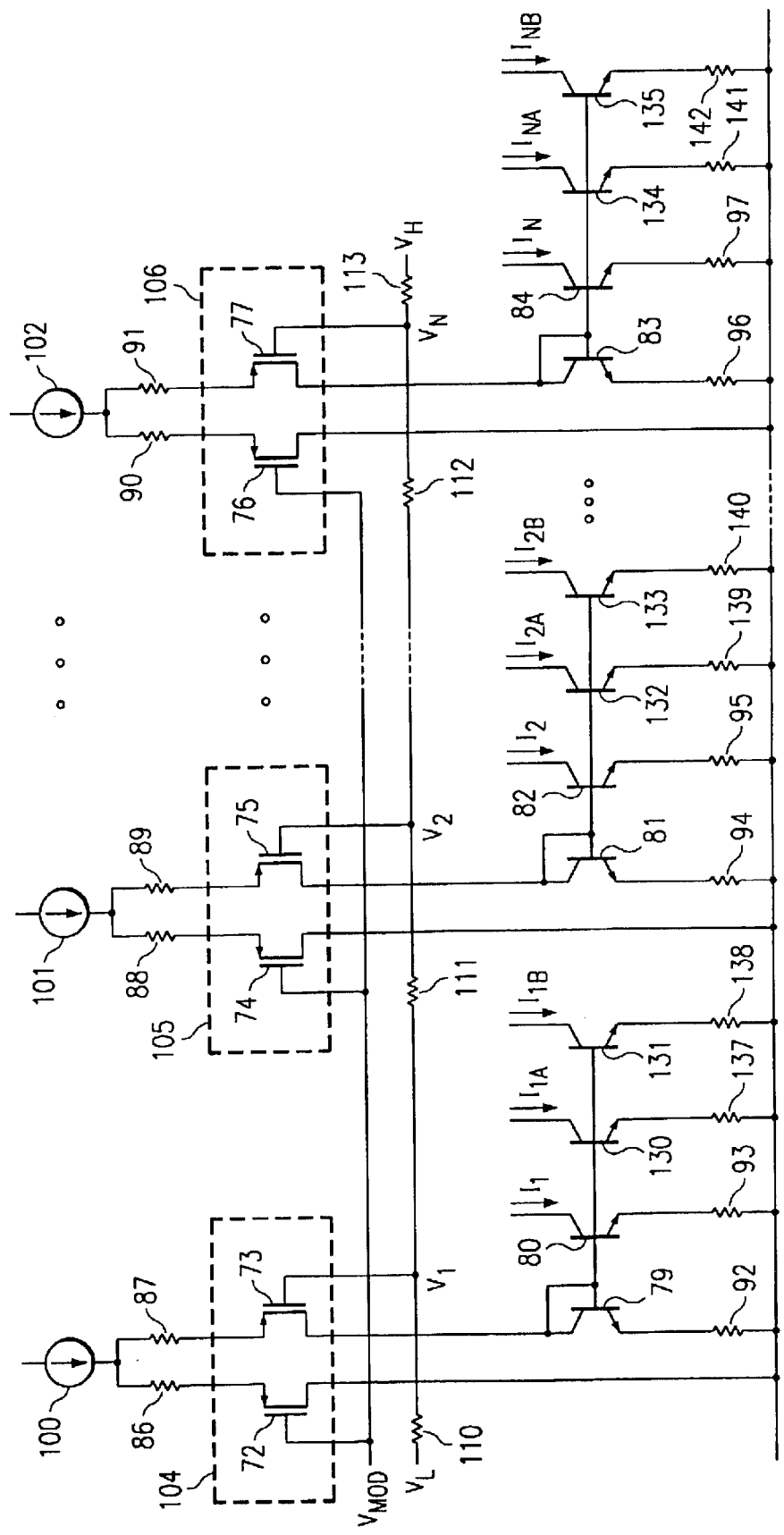
FIG. 7 is a schematic circuit diagram of an example circuit to generate the tail currents and the base driver bias currents for the circuit of FIG. 6.

An example circuit for generating the bias currents for the circuit of FIG. 6 is shown in FIG. 7. The circuit of FIG. 7 includes the circuit of FIG. 5 along with additional circuitry for generating the base driver currents $I_{1A}$–$I_{NA}$ and $I_{1B}$–$I_{NB}$. The additional circuitry includes transistors 130–135; resistors 137–142; and base driver currents $I_{1A}$–$I_{NA}$ and $I_{1B}$–$I_{NB}$.

Figure 8:
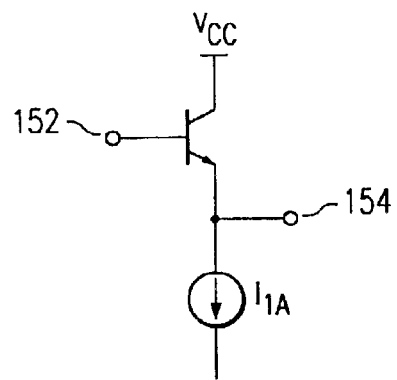
FIG. 8 is a schematic circuit diagram of an example base driver circuit.

An example of the base drivers is shown in FIG. 8. Referring to the base driver 62 in FIG. 6, the base driver 62 is simply an emitter follower 150 having an input coupled to node 152 and an output coupled to node 154. Bias current $I_{1A}$ supplies the emitter current. Other types of base driver circuits could also be used.

Figure 9:
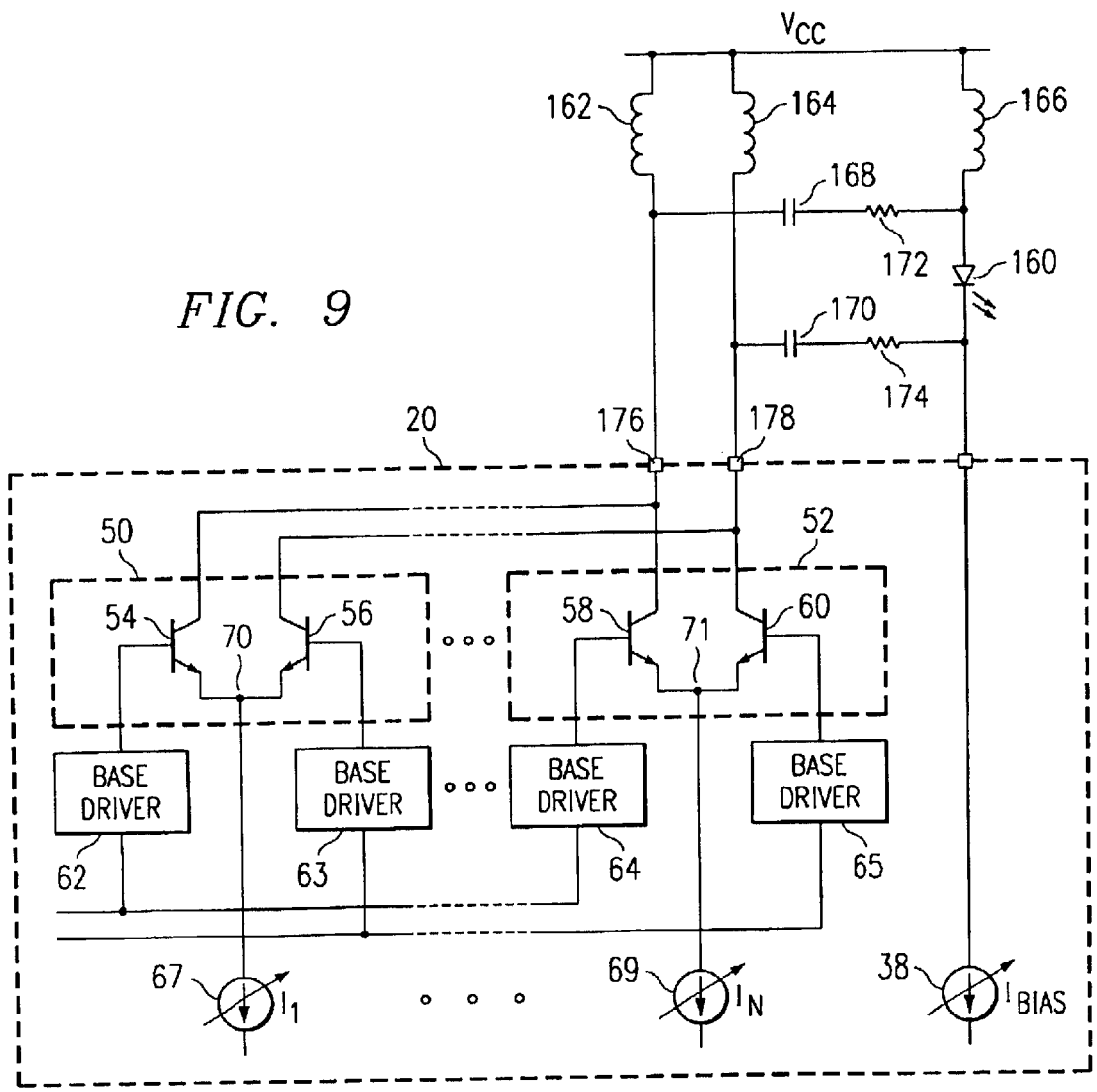
FIG. 9 is a schematic circuit diagram of a preferred embodiment laser driver circuit with tail currents in discrete subranges and having a differential output configuration.

FIG. 9 shows a similar circuit to the one in FIG. 3, but with a differential output configuration instead of the single ended configuration shown in FIG. 3. The output configuration of FIG. 9 includes laser diode 160; inductors 162, 164, and 166; capacitors 168 and 170; and resistors 172 and 174. In FIG. 8, the two branches 176 and 178 of the differential pairs are routed to opposite sides of the laser diode 160. Resistors 172 and 174 pad the dynamic diode resistance up to the characteristic impedance of the transmission line connecting the diode 160 with the driver chip. An additional inductor 166 is shown in series with the laser diode 160 to allow the current $I_{BIAS}$ to flow, but steer the high frequency AC modulation current from the differential pairs into the diode 160.

Figure 10:
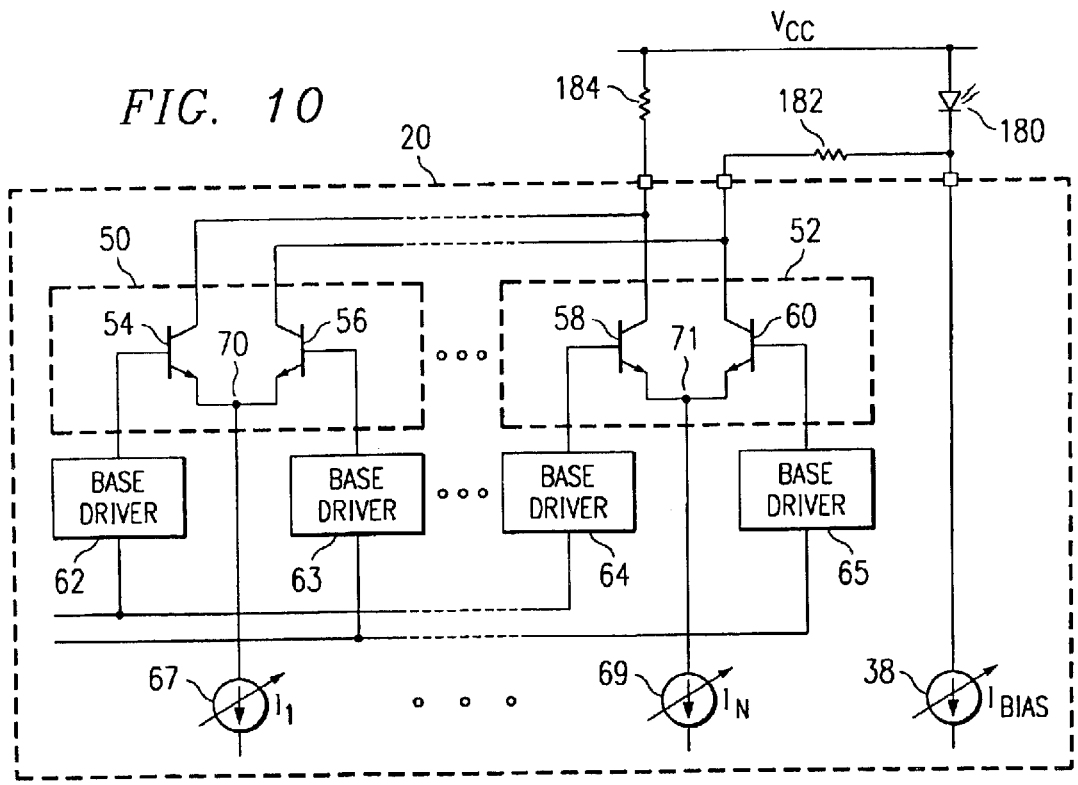
FIG. 10 is a schematic circuit diagram of a preferred embodiment laser driver circuit with tail currents in discrete subranges and having a DC coupled laser diode.

FIG. 10 shows a similar circuit to the one in FIG. 3, but with a DC coupled laser diode configuration instead of the AC coupled configuration shown in FIG. 3. The output configuration of FIG. 10 includes laser diode 180; and resistors 182 and 184.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   an output load;
   N differential pairs coupled in parallel, wherein N is an integer greater than one;
   a first branch of the N differential pairs is coupled to the output load;
   a second branch of the N differential pairs is coupled to a matching load;
   N tail current sources, each one of the N differential pairs is coupled to a corresponding one of the N tail current sources, each of the N tail current sources providing a current that varies within a limited range such that the N differential pairs operate at optimum bandwidth.

2. The circuit of claim 1 wherein the output load comprises a laser diode.

3. The circuit of claim 2 further comprising an impedance matching resistor coupled between the laser diode and the first branch of the N differential pairs.

4. The circuit of claim 2 further comprising:
   a capacitor coupled between the laser diode and the first branch of the N differential pairs; and
   an inductor coupled to the first branch of the N differential pairs.

5. The circuit of claim 1 wherein the matching load comprises a resistor.

6. The circuit of claim 5 wherein the matching load further comprises an inductor coupled in parallel with the resistor.

7. The circuit of claim 1 wherein each of the N differential pairs comprises two bipolar transistors having common emitters.

8. The circuit of claim 7 further comprising:
   a first base driver coupled to a base of a first one of the two bipolar transistors; and
   a second base driver coupled to a base of a second one of the two bipolar transistors.

9. The circuit of claim 8 wherein the first and second base drivers are activated when a corresponding one of the N tail current sources is activated.

10. The circuit of claim 2 further comprising a bias current source coupled to the laser diode.

11. The circuit of claim 1 wherein the N tail current sources comprise:

N differential pair comparators;

an input voltage coupled to first inputs of the N differential pair comparators;

N discrete tap voltages coupled to corresponding second inputs of the N differential pair comparators, wherein each of the N differential pair comparators provides a corresponding one of the N tail currents.

12. The circuit of claim 8 wherein the N tail current sources comprise:

N differential pair comparators;

an input voltage coupled to first inputs of the N differential pair comparators;

N discrete tap voltages coupled to corresponding second inputs of the N differential pair comparators, wherein each of the N differential pair comparators provides a corresponding one of the N tail currents and activates the first and second base drivers.

13. A circuit comprising:

a laser diode;

a bias current source coupled to the laser diode;

N differential pairs coupled in parallel, wherein N is an integer greater than one; and a first branch of the N differential pairs coupled to the laser diode.

14. The circuit of claim 13 further comprising N tail current sources, each of the N tail current sources is coupled to a corresponding one of the N differential pairs.

15. The circuit of claim 14 wherein each of the N tail current sources provides a current that varies within a limited range such that the N differential pairs operate at optimum bandwidth.

16. The circuit of claim 13 further comprising a capacitor coupled between the first branch of the N differential pairs and the laser diode.

17. The circuit of claim 16 further comprising an inductor coupled to the first branch of the N differential pairs.

18. The circuit of claim 13 further comprising an impedance matching resistor coupled between the first branch of the N differential pairs and the laser diode.

19. The circuit of claim 13 further comprising a matching load coupled to a second branch of the N differential pairs.

20. The circuit of claim 13 wherein each of the N differential pairs comprises two bipolar transistors having common emitters.

21. The circuit of claim 20 further comprising:

a first base driver coupled to a base of a first one of the two bipolar transistors; and a second base driver coupled to a base of a second one of the two bipolar transistors.

22. The circuit of claim 14 wherein the N tail current sources comprise:

N differential pair comparators;

an input voltage coupled to first inputs of the N differential pair comparators;

N discrete tap voltages coupled to corresponding second inputs of the N differential pair comparators, wherein each of the N differential pair comparators provides a corresponding one of the N tail currents.

23. A circuit comprising:

a differential output load;

N differential pairs coupled in parallel, wherein N is an integer greater than one;

a first branch of the N differential pairs is coupled to a first end of the differential output load;

a second branch of the N differential pairs is coupled to a second end of the differential output load;

N tail current sources, each one of the N differential pairs is coupled to a corresponding one of the N tail current sources, each of the N tail current sources providing a current that varies within a limited range such that the N differential pairs operate at optimum bandwidth.

24. The circuit of claim 23 wherein the differential output load comprises:

a laser diode;

a first capacitor coupled between a first end of the laser diode and the first branch of the N differential pairs;

a first inductor coupled to the first branch of the N differential pairs;

a second capacitor coupled between a second end of the laser diode and the second branch of the N differential pairs; and a second inductor coupled to the second branch of the N differential pairs.

* * * * *